United States Patent
Saitou

(10) Patent No.: US 10,763,331 B2
(45) Date of Patent: Sep. 1, 2020

(54) SEMICONDUCTOR DEVICE INCLUDING ION IMPLANTED ALIGNMENT MARKS AND METHOD OF MANUFACTURING THE SAME

(71) Applicant: Panasonic Intellectual Property Management Co., Ltd., Osaka (JP)

(72) Inventor: Kouichi Saitou, Toyama (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 15 days.

(21) Appl. No.: 16/140,776

(22) Filed: Sep. 25, 2018

(65) Prior Publication Data

US 2019/0103463 A1 Apr. 4, 2019

(30) Foreign Application Priority Data

Oct. 4, 2017 (JP) ................. 2017-194440

(51) Int. Cl.
| | |
|---|---|
| *H01L 29/16* | (2006.01) |
| *H01L 23/544* | (2006.01) |
| *H01L 21/033* | (2006.01) |
| *H01L 29/78* | (2006.01) |
| *H01L 21/04* | (2006.01) |
| *H01L 21/308* | (2006.01) |
| *H01L 29/66* | (2006.01) |

(52) U.S. Cl.
CPC ...... *H01L 29/1608* (2013.01); *H01L 21/0337* (2013.01); *H01L 21/0445* (2013.01); *H01L 21/3086* (2013.01); *H01L 23/544* (2013.01); *H01L 29/66068* (2013.01); *H01L 29/78* (2013.01); *H01L 29/7828* (2013.01); *H01L 2223/54426* (2013.01)

(58) Field of Classification Search
CPC ............... H01L 23/544; H01L 29/1608; H01L 2223/54426
See application file for complete search history.

(56) References Cited

U.S. PATENT DOCUMENTS

| | | | | |
|---|---|---|---|---|
| 6,297,108 B1 * | 10/2001 | Chu | ................ | H01L 21/823418 257/E21.619 |
| 2008/0153249 A1 * | 6/2008 | Yang | ....................... | G03F 9/708 438/401 |

FOREIGN PATENT DOCUMENTS

| | | |
|---|---|---|
| JP | 2007-280978 | 10/2007 |
| JP | 2008-053363 | 3/2008 |

* cited by examiner

*Primary Examiner* — Quoc D Hoang
(74) *Attorney, Agent, or Firm* — McDermott Will & Emery LLP

(57) ABSTRACT

A semiconductor device includes a bulk substrate, and an epitaxial layer formed on a surface of the bulk substrate. A part of the surface of the bulk substrate is an alignment region including an alignment pattern defined by at least one recess or one protrusion. An ion-injected layer is formed in at least a part of the alignment region.

6 Claims, 10 Drawing Sheets

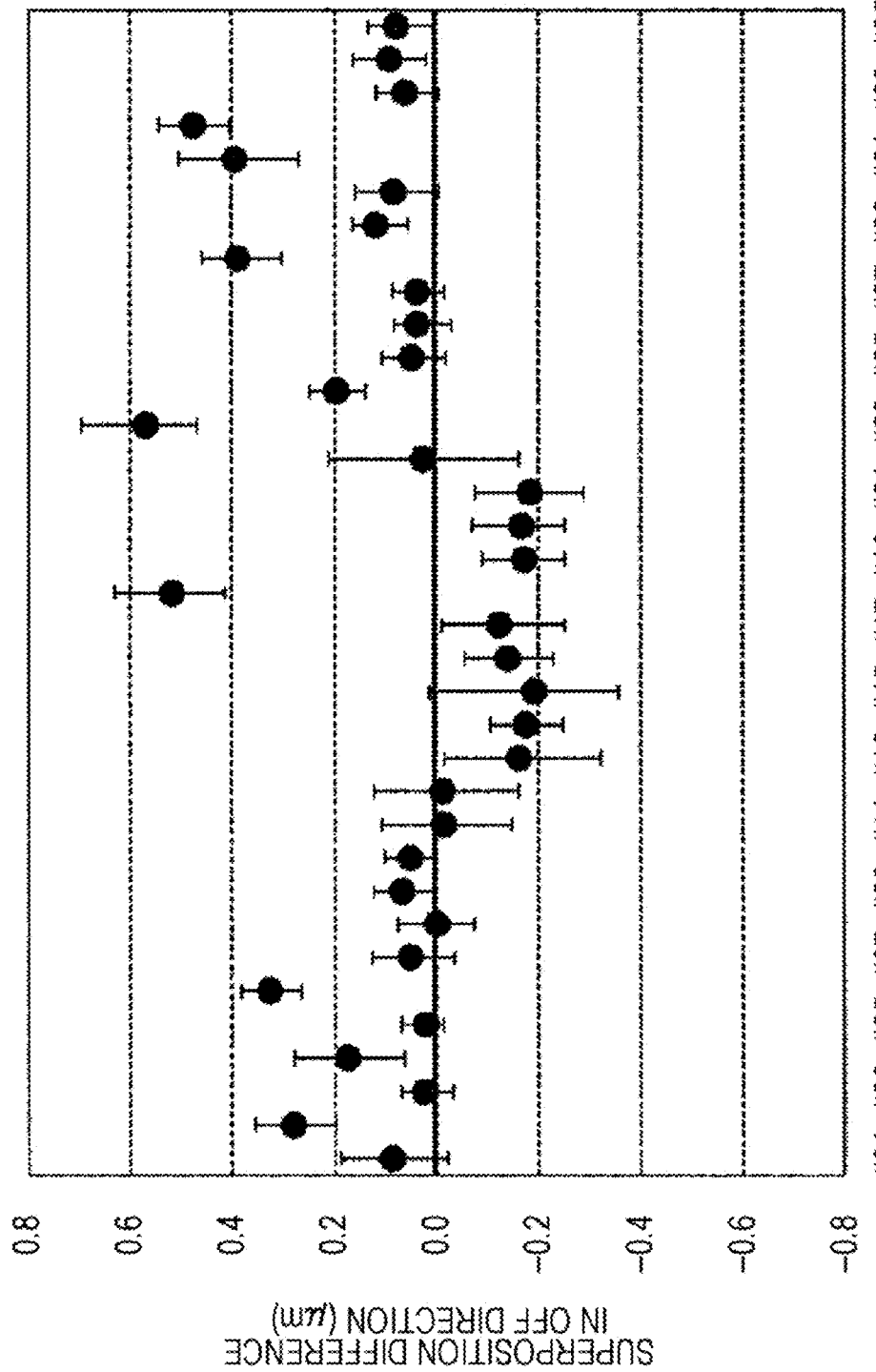

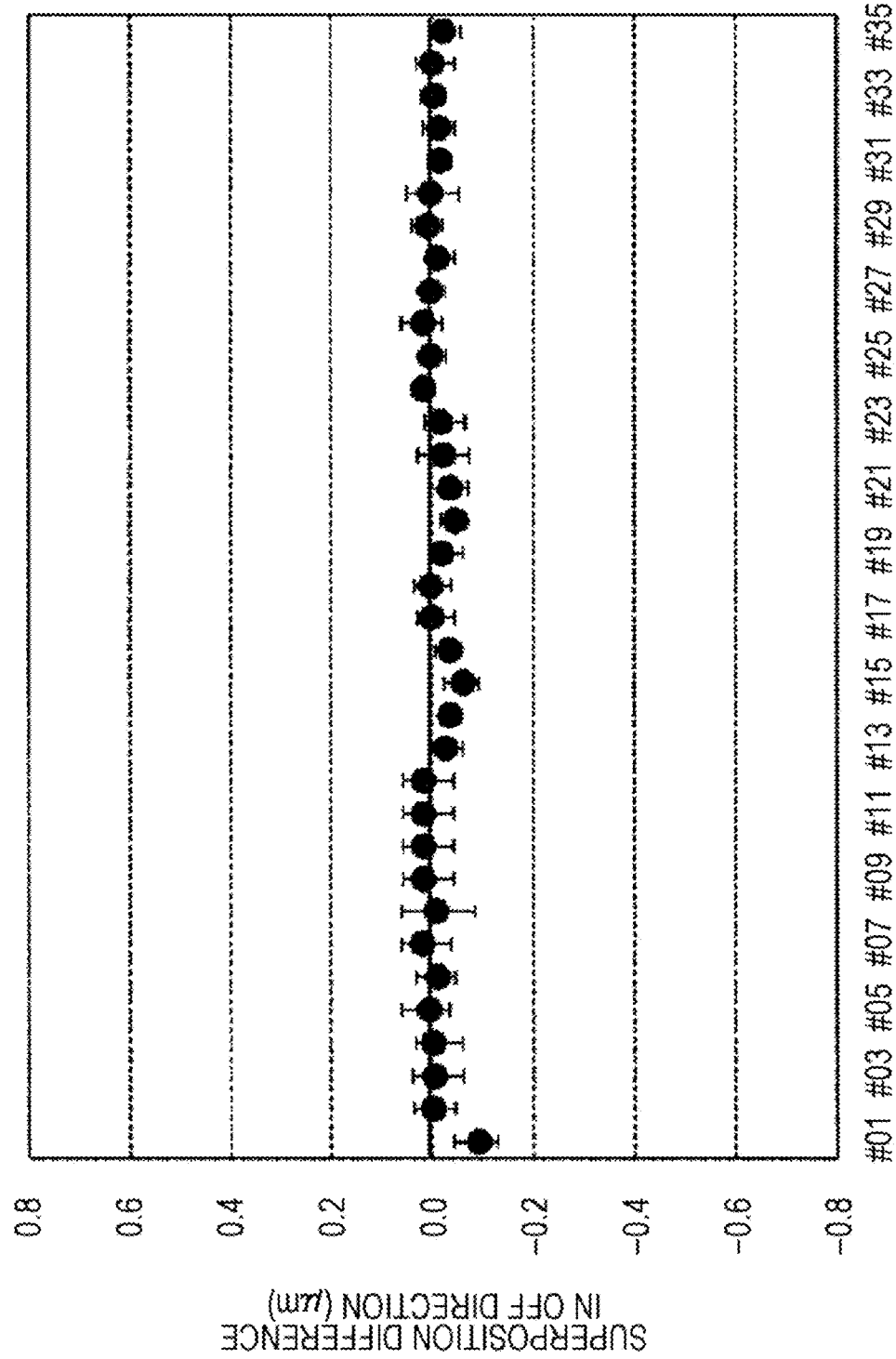

SEMICONDUCTOR DEVICE INCLUDING ION IMPLANTED ALIGNMENT MARKS AND METHOD OF MANUFACTURING THE SAME

BACKGROUND

1. Technical Field

The present disclosure relates to a semiconductor device and a method of manufacturing the same.

2. Description of the Related Art

A power semiconductor device is a semiconductor element applied to usage that requires high breakdown voltage and large current flow, and is desired to have a low-loss property. Conventionally, a power semiconductor device using a silicon (Si) substrate has been widely used, but in recent years, a power semiconductor device using a silicon carbide substrate has become popular and continuously developed.

Silicon carbide has an insulation breakdown voltage more than ten times higher than the insulation breakdown voltage of silicon. Thus, a power semiconductor device using silicon carbide can maintain high breakdown voltage even when the thickness of a depleted layer at a PN junction or a Schottky junction is reduced. Accordingly, the use of silicon carbide enables reduction of the thickness of a device and increase of doping concentration. For these reasons, silicon carbide is expected as a material for forming a power semiconductor device having a low ON-resistance, a high breakdown voltage, and a low loss property.

Recently, vehicles including a motor as a drive source, such as a hybrid vehicle, an electric vehicle, and a fuel battery automobile, have been developed. The above-described characteristics of silicon carbide are advantageous for a switching element of an inverter circuit configured to drive the motor of these vehicles, and thus power semiconductor devices using silicon carbide for on-board usage have been developed.

A power semiconductor device using silicon carbide (SiC) is typically produced by using a silicon carbide layer epitaxially grown on a silicon carbide substrate. For example, Unexamined Japanese Patent Publication No. 2007-280978 discloses a method of producing such a power semiconductor device using silicon carbide. A plurality of photolithography processes are performed through production of the power semiconductor device. Typically, an alignment pattern is formed on the silicon carbide layer in advance, and used as a reference to perform positioning of a photomask, in other words, mask positioning in each photolithography process. The alignment pattern is mainly defined by, for example, recess or protrusion formed in the silicon carbide layer through dry etching.

SUMMARY

A semiconductor device according to an aspect of the present disclosure includes a bulk substrate, and an epitaxial layer formed on a surface of the bulk substrate. A part of the surface of the bulk substrate is an alignment region including an alignment pattern defined by at least one recess or one protrusion. An ion-injected layer is formed in at least a part of the alignment region.

A semiconductor device manufacturing method according to another aspect of the present disclosure includes first to sixth steps. In the first step, a bulk substrate is prepared. In the second step, a resist film is formed on a surface of the bulk substrate. In the third step, a mask layer is formed by removing a part of the resist film through photolithography. In the fourth step, an alignment region including an alignment pattern is formed on the surface of the bulk substrate by etching the bulk substrate by using the mask layer. In the fifth step, the mask layer is removed. In the sixth step, ion injection in at least a part of the alignment region is performed.

Each above-described comprehensive or specific aspect may be achieved by a system, a method, an integrated circuit, a computer program, or a recording medium. Alternatively, the aspect may be achieved by an optional combination of a system, a device, a method, an integrated circuit, a computer program, and a recording medium.

According to the technology of the present disclosure, the coordinates of a position of an alignment pattern which is used to produce a semiconductor device can be accurately estimated, thereby achieving improved accuracy of mask positioning.

BRIEF DESCRIPTION OF THE DRAWINGS

FIG. 6A is a diagram illustrating an exemplary difference amount of superposition in off direction 22 when gate electrode 18 is superposed on bulk substrate 11 by using alignment pattern 21 in which no ion-injected layer 25 is formed; and FIG. 6B is a diagram illustrating an exemplary difference amount of superposition in off direction 22 when gate electrode 18 is superposed on bulk substrate 11 by using alignment pattern 21 in which ion-injected layer 25 is formed.

DETAILED DESCRIPTION OF EMBODIMENT

Figure 1A:
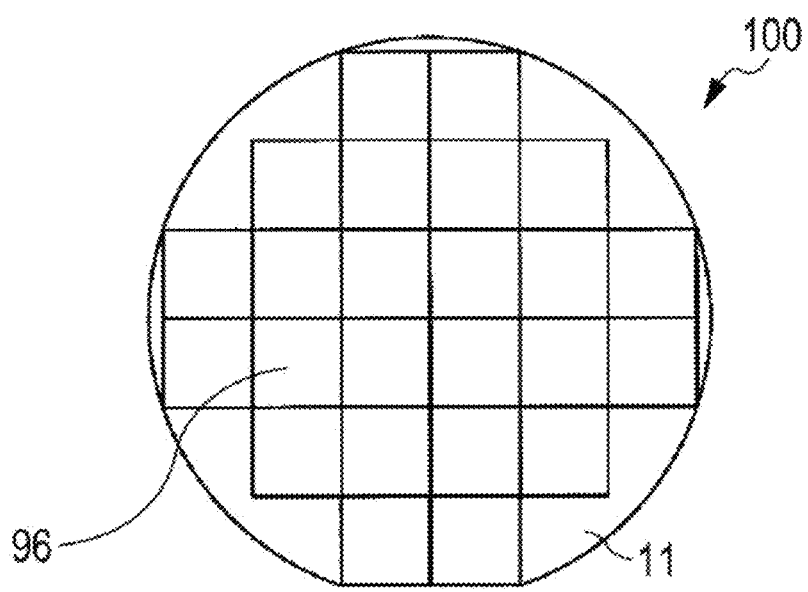
FIG. 1A is a top view schematically illustrating an exemplary configuration of bulk substrate 11 used for semiconductor device 100 according to the present exemplary embodiment.

The present disclosure provides the novel technology of accurately estimating the coordinates of a position of an alignment pattern which is used to produce a semiconductor device such as a power semiconductor device, thereby achieving improved accuracy of mask positioning.

(Knowledge Underlying the Present Disclosure)

Prior to describing an exemplary embodiment of the present disclosure, knowledge that underlies the present disclosure will now be described. Hereinafter, a power semiconductor device is referred to as a semiconductor device.

In manufacturing of a semiconductor device, an epitaxial layer is formed on the surface of a bulk substrate made of silicon carbide in some cases. To form the epitaxial layer with less defect, typically, an off substrate, the (0001) surface of which is not parallel to the surface of the bulk substrate is used as the bulk substrate made of silicon carbide. The surface of the off substrate includes a large number of minute steps. Thus, through the progress of step-flow growth, a facet surface made of the (0001) surface is generated on the upper surface of the epitaxial layer. When the surface of the bulk substrate includes an alignment pattern defined by at least one recess or one protrusion, the coordinates of the alignment pattern positioned below the epitaxial layer cannot be accurately estimated due to the existence of the facet surface, which decreases the accuracy of mask positioning.

Unexamined Japanese Patent Publication No. 2007-280978 discloses a semiconductor device manufacturing method capable of reducing such decrease of the estimation accuracy of the alignment pattern.

In the method of Unexamined Japanese Patent Publication No. 2007-280978, a first alignment pattern is formed on an off substrate, and then the off substrate is tilted so that a second alignment pattern is formed in a direction orthogonal to the (0001) surface of the off substrate. Mask positioning is performed by using the first alignment pattern before an epitaxial layer is formed, but mask positioning is performed by using the second alignment pattern after the epitaxial layer is formed. No facet surface is generated in the epitaxial layer formed on the second alignment pattern, and thus decrease of the estimation accuracy of the second alignment pattern is reduced.

However, in the method of Unexamined Japanese Patent Publication No. 2007-280978, the process of tilting the off substrate to form the second alignment pattern is redundant.

Based on the above-described knowledge, the inventors of the present application have thought of a semiconductor device and a method of manufacturing the same described at the following items.

[Item 1]

A semiconductor device includes a bulk substrate, and an epitaxial layer formed on a surface of the bulk substrate. A part of the surface of the bulk substrate is an alignment region including an alignment pattern defined by at least one recess or one protrusion. An ion-injected layer is formed in at least a part of the alignment region.

[Item 2]

In the semiconductor device according to Item 1, when viewed in a direction perpendicular to the surface of the bulk substrate, the epitaxial layer has a facet surface overlapping with a part of an edge of the at least one recess or one protrusion.

[Item 3]

In the semiconductor device according to Item 2, the facet surface has a pair of sides each parallel to the part of the edge of the at least one recess or one protrusion. When the bulk substrate is defined to be a lower part of the semiconductor device, and the epitaxial layer is defined to be an upper part of the semiconductor device, at least a part of the ion-injected layer is positioned directly below a side at an upper position among the pair of sides.

[Item 4]

In the semiconductor device according to Item 2 or 3, the bulk substrate is an off substrate. The alignment pattern is defined by the at least one recess. A part of the edge of the at least one recess extends in a direction orthogonal to an off direction of the off substrate, and is positioned at downstream side with respect to a center of the at least one recess in the off direction.

[Item 5]

In the semiconductor device according to Item 2 or 3, the bulk substrate is an off substrate. The alignment pattern is defined by the at least one protrusion. A part of the edge of the at least one protrusion extends in a direction orthogonal to an off direction of the off substrate, and is positioned at upstream side with respect to a center of the at least one protrusion in the off direction.

[Item 6]

In the semiconductor device according to any one of Items 1 to 5, the semiconductor device is a metal oxide semiconductor field effect transistor (MOSFET).

[Item 7]

A semiconductor device manufacturing method includes: a first step of preparing a bulk substrate; a second step of forming a resist film on a surface of the bulk substrate; a third step of forming a mask layer by removing a part of the resist film through photolithography; a fourth step of forming an alignment region including an alignment pattern on the surface of the bulk substrate by etching the bulk substrate by using the mask layer; a fifth step of removing the mask layer; and a sixth step of performing ion injection into at least a part of the alignment region.

[Item 8]

The semiconductor device manufacturing method according to Item 7 further includes, after the sixth process, a seventh step of forming an epitaxial layer on the surface of the bulk substrate.

[Item 9]

In the semiconductor device manufacturing method according to Item 7 or 8 further include a step of manufacturing a metal oxide semiconductor field effect transistor (MOSFET). The sixth step is performed simultaneously with ion injection into a peripheral region in the step of manufacturing MOSFET.

Accordingly, the coordinates of a position of an alignment pattern which is used to produce a semiconductor device can be accurately estimated, thereby achieving improved accuracy of mask positioning.

The following describes a more specific exemplary embodiment of the present disclosure. However, redundantly detailed description will be omitted in some cases. For example, detailed description of any already well-known matter and duplicate description of effectively identical configurations will be omitted in some cases. This avoids unnecessary redundancy of the following description and facilitates understanding of the skilled person in the art. The inventors provide the accompanying drawings and the following description to allow the skilled person in the art to sufficiently understand the present disclosure, but do not intend to limit an idea described in the claims with the drawings and description. In the following description, any components having identical or similar functions are denoted by an identical reference number.

Exemplary Embodiment

The following comprehensively describes the present disclosure with reference to pattern diagrams. A semiconductor device according to an exemplary embodiment of the present disclosure is, for example, a metal oxide semiconductor field effect transistor (MOSFET) or a Schottky barrier diode.

FIG. 1A is a top view schematically illustrating an exemplary configuration of bulk substrate 11 used for semiconductor device 100 according to the present exemplary embodiment. The bulk substrate according to the present disclosure may be formed of single-crystal semiconductor. Bulk substrate 11 includes a plurality of shot regions 96. Bulk substrate 11 is, for example, an off substrate made of 4H—SiC. The surface of the off substrate is tilted, for example, by a few degrees in the <11-20> direction with respect to the (0001) surface. Bulk substrate 11 has a diameter of, for example, three inches. A conductivity type of bulk substrate 11 is n type. And bulk substrate 11 has a resistivity of 0.02 Ωcm approximately. Each shot region 96 corresponds to one stepper shot, and has a dimension of, for example, 15 mm×15 mm Bulk substrate 11 may be formed of semiconductor material other than silicon carbide.

Figure 1B:
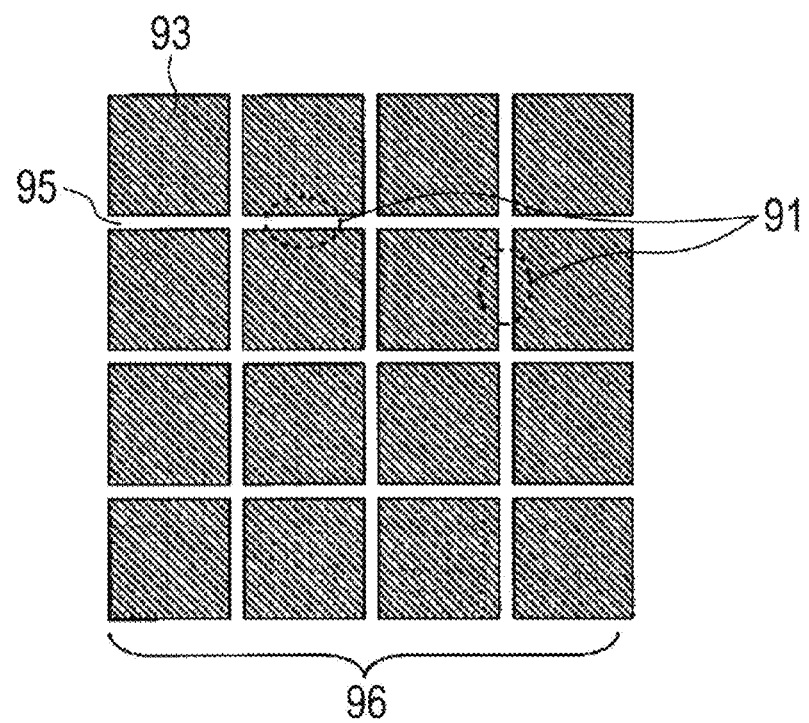
FIG. 1B is a top view schematically illustrating an exemplary configuration in which a plurality of element regions 93 are arrayed in each shot region 96.

FIG. 1B is a top view schematically illustrating an exemplary configuration in which a plurality of element regions 93 are arrayed in each shot region 96. Each element region 93 is a region in which a semiconductor element such as a transistor or a diode is formed, and has a dimension of, for example, 3 mm×3 mm. In the example illustrated in FIG. 1B, 4×4 element regions 93 are arrayed in each shot region 96 at intervals from each other. A region other than element regions 93 in each shot regions 96 is scribe region 95. Scribe region 95 is finally removed by cutting. At least one alignment region 91 including an alignment pattern is provided in scribe region 95 of each shot region 96. In the example illustrated in FIG. 1B, scribe region 95 includes a plurality of parts extending in a longitudinal direction and a plurality of parts extending in a lateral direction. In scribe region 95, alignment region 91 may be provided in each of one of the plurality of parts extending in the longitudinal direction and one of the plurality of parts extending in the lateral direction.

Figure 1C:
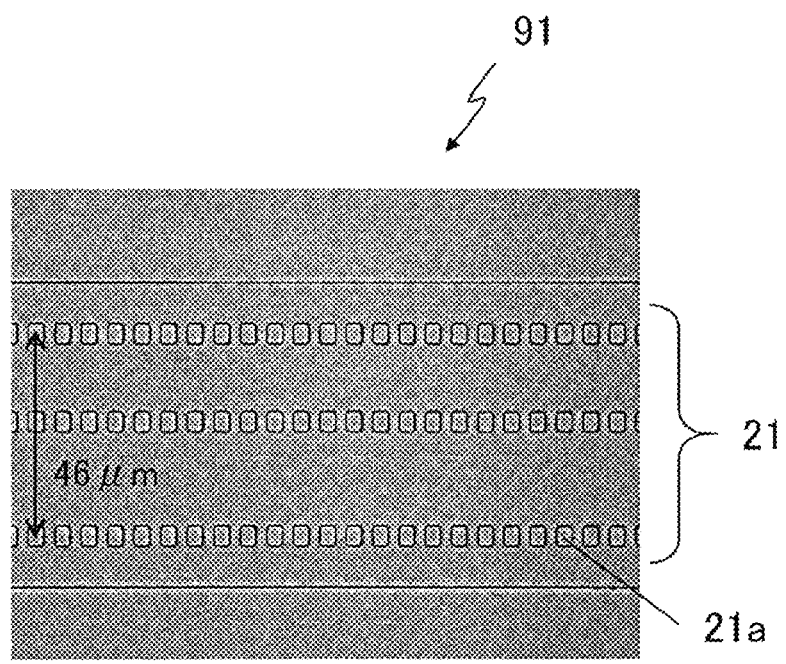
FIG. 1C is a photograph showing an optical microscope image of exemplary alignment pattern 21 formed in alignment region 91.

FIG. 1C is a photograph showing an optical microscope image of exemplary alignment pattern 21 formed in alignment region 91. In the example illustrated in FIG. 1C, alignment pattern 21 is defined by a plurality of recesses 21a, but is not limited to this configuration. For example, alignment pattern 21 may be defined by a plurality of protrusions. Alignment pattern 21 is used to perform mask positioning.

Before description of the present exemplary embodiment, any problem that occurs when an epitaxial layer is formed on the surface of a normal bulk substrate will be described below.

Figure 2A:
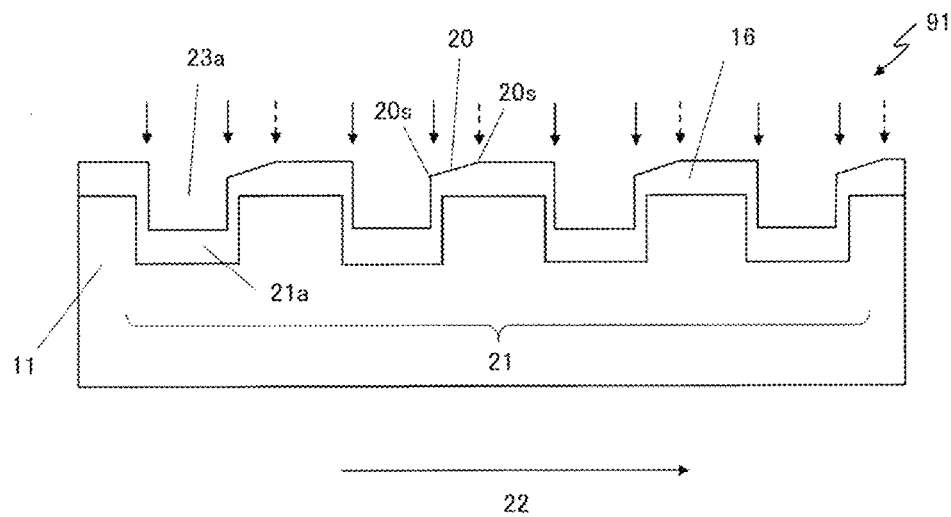
FIG. 2A is a cross-sectional view schematically illustrating alignment region 91 of a semiconductor device in which epitaxial layer 16 is formed on the surface of bulk substrate 11 according to Comparative Example.
Figure 2B:
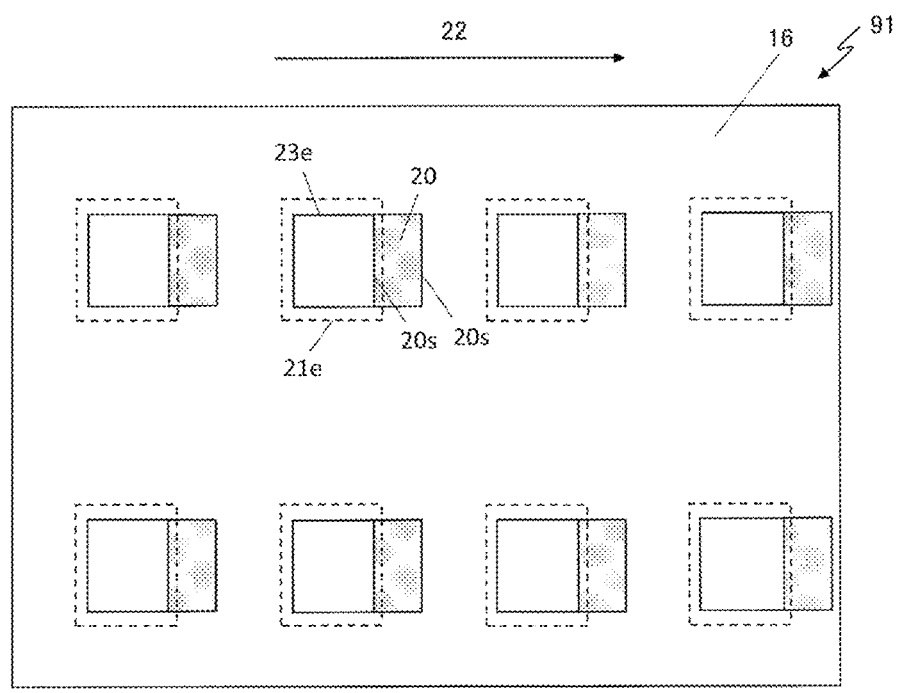
FIG. 2B is a top view schematically illustrating alignment region 91 of the semiconductor device in which epitaxial layer 16 is formed on the surface of bulk substrate 11 according to Comparative Example.

FIGS. 2A and 2B are a cross-sectional view and a top view, respectively, schematically illustrating alignment region 91 of a semiconductor device in which epitaxial layer 16 is formed on the surface of bulk substrate 11 according to Comparative Example. Bulk substrate 11 is an off substrate formed of silicon carbide. The rightward arrow indicates off direction 22. Off direction 22 is the <11-20> direction. By way of analogy, the arrow of off direction 22 represents the direction of water flow, and an "upstream side in off direction 22" and a "downstream side in off direction 22" are defined with respect to the direction. In FIGS. 2A and 2B, the upstream side in off direction 22 is on the left side, and the downstream side in off direction 22 is on the right side.

Alignment pattern 21 is defined by the plurality of recesses 21a. A rectangular dashed line in FIG. 2B indicates edges 21e of each recess 21a positioned below epitaxial layer 16. New recesses 23a on which recesses 21a are reflected are formed on the upper surface of epitaxial layer 16. Simultaneously, facet surface 20 made of the (0001) surface is formed on an edge orthogonal to off direction 22 and positioned at the downstream side among edges 23e of each new recess 23a. As illustrated in FIG. 2A, facet surface 20 is tilted so that the height of facet surface 20 relative to the surface of bulk substrate 11 increases from the upstream side toward the downstream side in off direction 22.

New recesses 23a on the upper surface of epitaxial layer 16 are used to estimate the coordinates of alignment pattern 21 positioned below epitaxial layer 16. Through formation of epitaxial layer 16, each new recess 23a has a size smaller than the size of the corresponding recess 21a on the surface of bulk substrate 11. However, as illustrated in FIG. 2B, when viewed in a direction perpendicular to the surface of bulk substrate 11, the center of new recess 23a substantially overlaps with the center of the corresponding recess 21a on the surface of bulk substrate 11. Thus, the coordinates of alignment pattern 21 can be accurately estimated by accurately recognizing new recess 23a.

Typical methods of estimating the coordinates of alignment pattern 21 include a method using grayscale contrast and a method using laser beam reflection.

Any of the above-described methods can accurately recognize an edge parallel to off direction 22 and the edge orthogonal to off direction 22 and positioned at the upstream side among edges 23e of each new recess 23a. However, none of the above-described methods can accurately recognize an edge orthogonal to the off direction and positioned on the downstream side.

Each facet surface 20 has a pair of sides 20s orthogonal to off direction 22. Among the pair of sides 20s, a side positioned at the upstream side in the off direction needs to be recognized as the edge orthogonal to the off direction and positioned at the downstream side among edges 23e of the corresponding new recess 23a. However, among the pair of sides 20s, a side positioned at the downstream side in the off direction can be wrongly recognized as the edge orthogonal to the off direction and positioned at the downstream side among edges 23e of new recess 23a. In FIG. 2A, each downward arrow illustrated with a solid line indicates an edge needs to be recognized, and each downward arrow illustrated with a dashed line indicates an edge that can be wrongly recognized.

The above-described wrong recognition prevents accurate estimation of the coordinates of alignment pattern 21.

In the present exemplary embodiment, an ion-injected layer is formed on the surface of bulk substrate 11 to avoid the above-described wrong recognition.

Figure 3A:
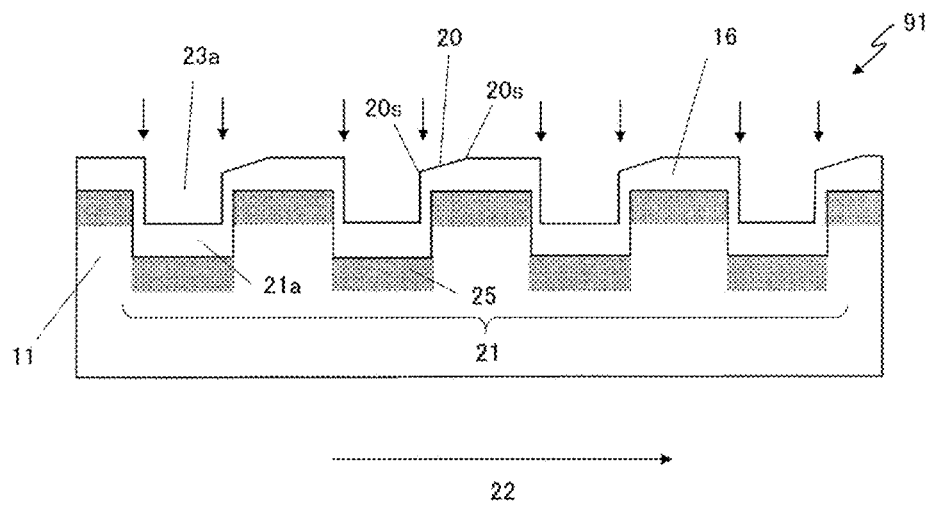
FIG. 3A is a cross-sectional view schematically illustrating an exemplary configuration of alignment region 91 of semiconductor device 100 in which epitaxial layer 16 is formed on the surface of bulk substrate 11 according to the present exemplary embodiment.
Figure 3B:
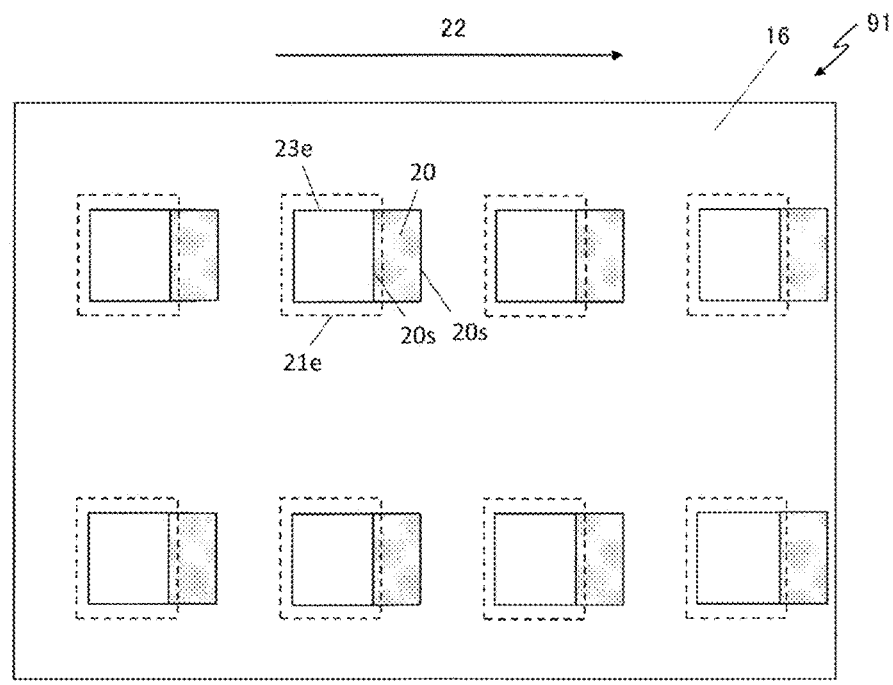
FIG. 3B is a top view schematically illustrating the exemplary configuration of alignment region 91 of semiconductor device 100 in which epitaxial layer 16 is formed on the surface of bulk substrate 11 according to the present exemplary embodiment.

FIGS. 3A and 3B are a cross-sectional view and a top view, respectively, schematically illustrating an exemplary configuration of alignment region 91 of semiconductor device 100 in which epitaxial layer 16 is formed on the surface of bulk substrate 11 according to the present exemplary embodiment. Any component description duplicate with description in Comparative Example above will be omitted in some cases. In the following description, bulk substrate 11 is defined to be the lower part of semiconductor device 100, and epitaxial layer 16 is defined to be the upper part of semiconductor device 100.

Semiconductor device 100 according to the present exemplary embodiment includes bulk substrate 11 and epitaxial layer 16. Epitaxial layer 16 is formed on the surface of bulk substrate 11. A part of the surface of bulk substrate 11 includes alignment region 91. Alignment region 91 includes alignment pattern 21 defined by at least one recess 21a. A protrusion may be used in place of recess 21a. Ion-injected layer 25 is formed in at least a part of alignment region 91.

Epitaxial layer 16 includes facet surface 20. When viewed in a direction perpendicular to on the upper surface of bulk substrate 11, facet surface 20 overlaps with a part of an edge of at least one recess 21a. As illustrated in FIG. 3A, facet surface 20 is tilted so that the height of facet surface 20 relative to the surface of bulk substrate 11 increases from the upstream side toward the downstream side in off direction 22. This is same for the configuration in which a protrusion is used in place of recess 21a.

As described above, bulk substrate 11 is an off substrate. When alignment pattern 21 is defined by at least one recess 21a, part of the edge of at least one recess 21a is orthogonal to off direction 22 and positioned on the downstream side in off direction 22. Although not illustrated, when alignment pattern 21 is defined by at least one protrusion, part of the edge of the at least one protrusion is orthogonal to off direction 22 of the off substrate and positioned at the upstream side in off direction 22.

As illustrated in FIGS. 2B and 3B, the upper surface of epitaxial layer 16 has substantially no structural difference between when no ion-injected layer 25 is formed on the surface of bulk substrate 11 and when ion-injected layer 25 is formed on the surface of bulk substrate 11. Thus, the above-described wrong recognition can occur when grayscale contrast is used.

However, the coordinates of alignment pattern 21 can be accurately estimated by using laser beam reflection.

The crystalline property of epitaxial layer 16 is different between when no ion-injected layer 25 is formed on the surface of bulk substrate 11 and when ion-injected layer 25 is formed on the surface of bulk substrate 11. The crystalline property of epitaxial layer 16 formed on ion-injected layer 25 is disordered. Thus, a laser beam is scattered at the upper surface of epitaxial layer 16. As a result, side 20s at a higher (upper) position among the pair of sides 20s of each facet surface 20 is not recognized due to laser beam reflection. In the example illustrated in FIG. 3A, the side 20s at a higher position among the pair of sides 20s corresponds to side 20s positioned on the downstream side in off direction 22 among the pair of sides 20s.

Edges 23e of each new recess 23a include a relatively large step in the direction orthogonal to bulk substrate 11. Thus, edges 23e of new recess 23a can be accurately recognized through laser beam reflection when the crystalline property of epitaxial layer 16 is disordered. Accordingly, the coordinates of alignment pattern 21 can be accurately estimated after epitaxial layer 16 is formed, thereby achieving improved accuracy of mask positioning.

As understood from the above description, ion-injected layer 25 does not need to be formed on the entire surface of bulk substrate 11. At least a part of ion-injected layer 25 may be positioned directly below the side 20s at a higher position among the pair of sides 20s of facet surface 20.

Scribe region 95 including alignment region 91 is finally removed by cutting. However, part of alignment pattern 21 in which ion-injected layer 25 is formed can remain in semiconductor device 100. This indicates that the present exemplary embodiment is applied to semiconductor device 100.

The following describes a method of manufacturing semiconductor device 100 according to the present exemplary embodiment.

FIGS. 4A to 4F are diagrams schematically illustrating an exemplary process of manufacturing alignment region 91 of semiconductor device 100 according to the present exemplary embodiment.

The process of manufacturing alignment region 91 of semiconductor device 100 according to the present exemplary embodiment includes the following steps.

Figure 4A:
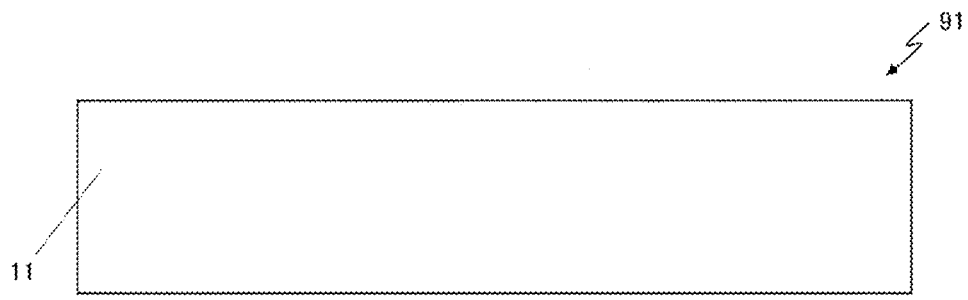
FIG. 4A is a diagram schematically illustrating an exemplary process of manufacturing alignment region 91 of semiconductor device 100 according to the present exemplary embodiment.

In a first step illustrated in FIG. 4A, bulk substrate 11 is prepared.

Figure 4B:
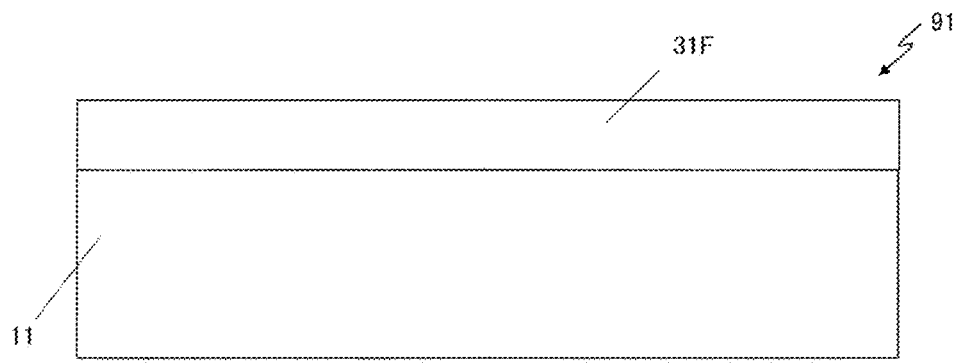
FIG. 4B is a diagram schematically illustrating the exemplary process of manufacturing alignment region 91 of semiconductor device 100 according to the present exemplary embodiment.

In a second step illustrated in FIG. 4B, resist film 31F is formed on the surface of bulk substrate 11.

Figure 4C:
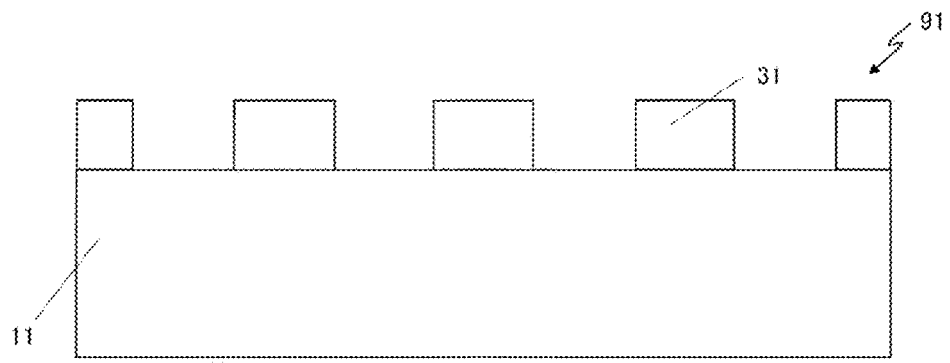
FIG. 4C is a diagram schematically illustrating the exemplary process of manufacturing alignment region 91 of semiconductor device 100 according to the present exemplary embodiment.

In a third step illustrated in FIG. 4C, mask layer 31 is formed by removing a part of resist film 31F through photolithography.

Figure 4D:
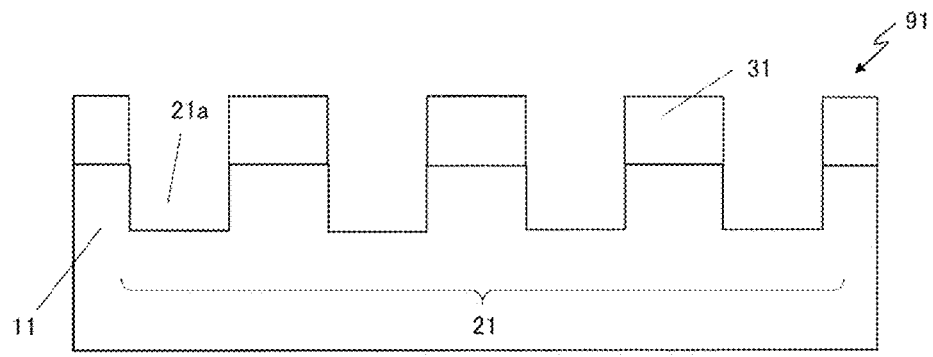
FIG. 4D is a diagram schematically illustrating the exemplary process of manufacturing alignment region 91 of semiconductor device 100 according to the present exemplary embodiment.

In a fourth step illustrated in FIG. 4D, alignment region 91 including alignment pattern 21 is formed by etching bulk substrate 11 by using mask layer 31. Alignment pattern 21 can be formed by removing a part of the surface of bulk substrate 11 through dry etching. Etching gas is, for example, mixed gas of $CF_4$ and $O_2$. A step included in each recess 21a has a size of, for example, 0.3 μm approximately.

Figure 4E:
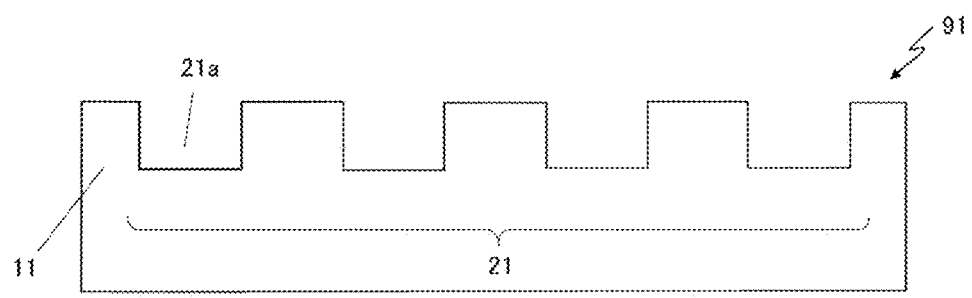
FIG. 4E is a diagram schematically illustrating the exemplary process of manufacturing alignment region 91 of semiconductor device 100 according to the present exemplary embodiment.

In a fifth step illustrated in FIG. 4E, mask layer 31 is removed.

Figure 4F:
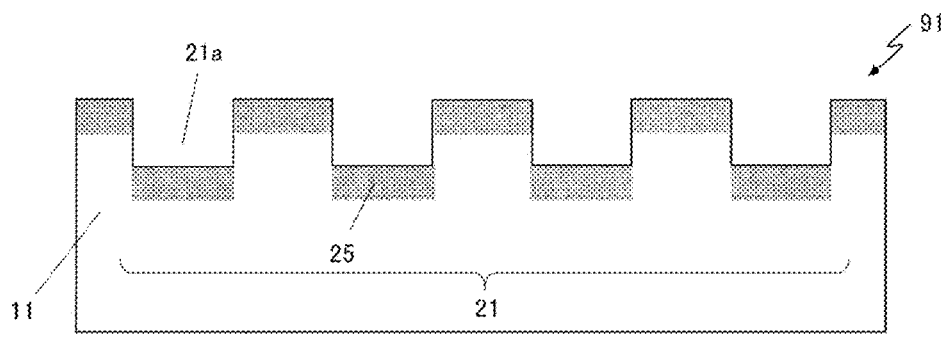
FIG. 4F is a diagram schematically illustrating the exemplary process of manufacturing alignment region 91 of semiconductor device 100 according to the present exemplary embodiment.

In a sixth step illustrated in FIG. 4F, ion injection is performed in at least a part of the alignment region. The type of injected ions is, for example, nitrogen. Nitrogen ions in dose amounts of $4.5 \times 10^{14}$ cm 2, $2.0 \times 10^{14}$ cm$^{-2}$, and $1.7 \times 10^{14}$ cm$^{-2}$ are injected at acceleration energies of 90 keV, 55 keV, and 30 keV, respectively. In this case, the concentration of nitrogen ions at a depth of 250 nm is $5.0 \times 10^{19}$ cm$^{-3}$. The ions at high concentration only need to exist substantially at a depth of 50 nm, but not at a further deeper place. The type of ions is preferably a heavier substance, and may be, for example, aluminum.

Semiconductor device 100 illustrated in FIG. 3A is obtained by forming epitaxial layer 16 on the exemplary configuration illustrated in FIG. 4F.

The following describes exemplary application of the present exemplary embodiment to a MOSFET manufacturing process.

FIGS. 5A to 5E are diagrams schematically illustrating an exemplary process of manufacturing a MOSFET to which the present exemplary embodiment is applied.

Figure 5A:
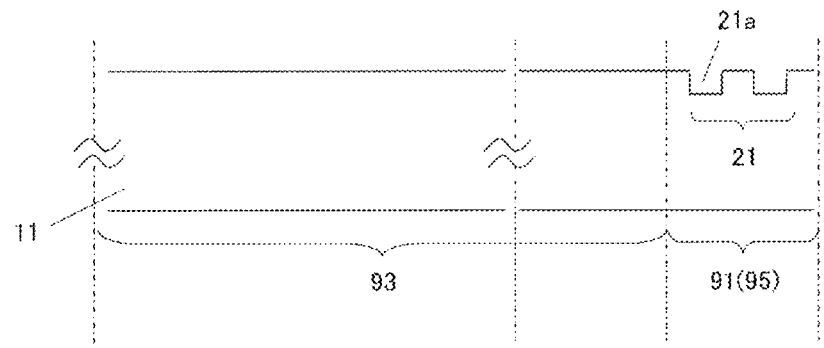
FIG. 5A is a diagram schematically illustrating an exemplary process of manufacturing a MOSFET to which the present exemplary embodiment is applied.

As illustrated in FIG. 5A, alignment pattern 21 defined by a plurality of recesses 21a is formed in alignment region 91 of bulk substrate 11. Alignment region 91 is formed in scribe region 95. In the example illustrated in FIG. 5A, alignment region 91 and scribe region 95 are same. A region adjacent to scribe region 95 is element region 93. Bulk substrate 11 is, for example, an off substrate made of 4H—SiC as described above. The off substrate has the n conductive type, an impurity concentration of $5 \times 10^{15}$ cm$^{-3}$, and a thickness of 15 μm approximately.

Figure 5B:
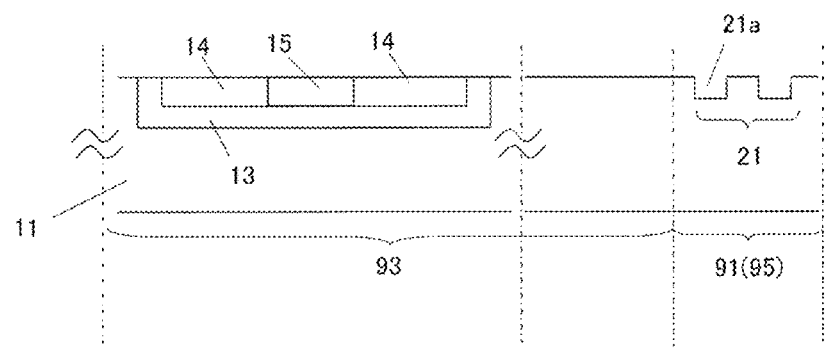
FIG. 5B is a diagram schematically illustrating the exemplary process of manufacturing the MOSFET to which the present exemplary embodiment is applied.

As illustrated in FIG. 5B, p-type well region 13, n-type source region 14, and p contact region 15 are formed in bulk substrate 11. For example, aluminum as p-type dopant is injected into a region in which p-type well region 13 is to be formed. Similarly, for example, nitrogen as n-type dopant is injected into a region in which n-type source region 14 is to be formed, and, for example, aluminum as p-type dopant is injected into a region in which p$^+$ contact region 15 is to be formed. In each of these steps, mask positioning is performed by using alignment pattern 21.

Figure 5C:
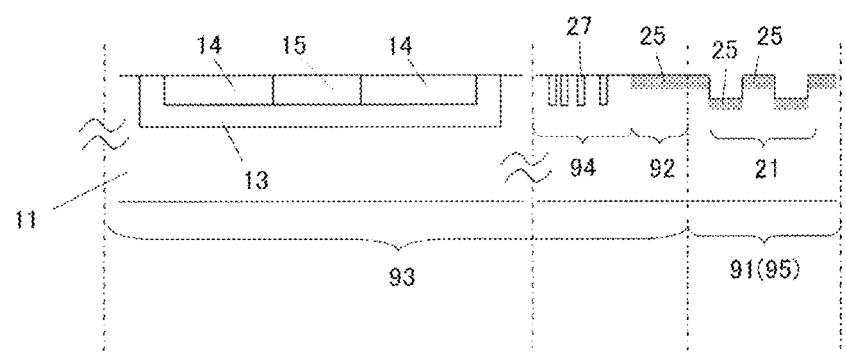
FIG. 5C is a diagram schematically illustrating the exemplary process of manufacturing the MOSFET to which the present exemplary embodiment is applied.

As illustrated in FIG. 5C, ion-injected layer 25 is formed in peripheral region 92 of element region 93 to prevent insulation breakdown. Simultaneously, ion-injected layer 25 is also formed in alignment pattern 21. Thus, no additional process is needed for ion injection into alignment pattern 21. Ion-injected layer 25 may be formed simultaneously with formation of n-type source region 14 in FIG. 5B. In addition, in element region 93, field limiting ring (FLR) 27 is formed in region 94 adjacent to peripheral region 92. FLR 27 increases the breakdown voltage of the MOSFET. FLR 27 may be formed through another process.

Figure 5D:
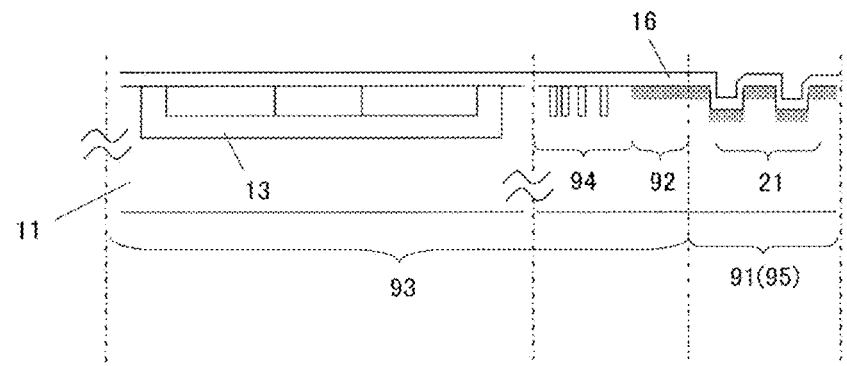
FIG. 5D is a diagram schematically illustrating the exemplary process of manufacturing the MOSFET to which the present exemplary embodiment is applied.

As illustrated in FIG. 5D, epitaxial layer 16 is formed on bulk substrate 11 through epitaxial growth. Epitaxial layer 16 is, for example, a 4H—SiC layer having an average impurity concentration of $2 \times 10^{17}$ cm$^{-3}$ approximately and a thickness of 0.2 μm approximately. The impurity concentration and thickness of epitaxial layer 16 are selected as appropriate in accordance with desired element specifications, and thus are not limited to the above-described concentration and thickness.

Figure 5E:
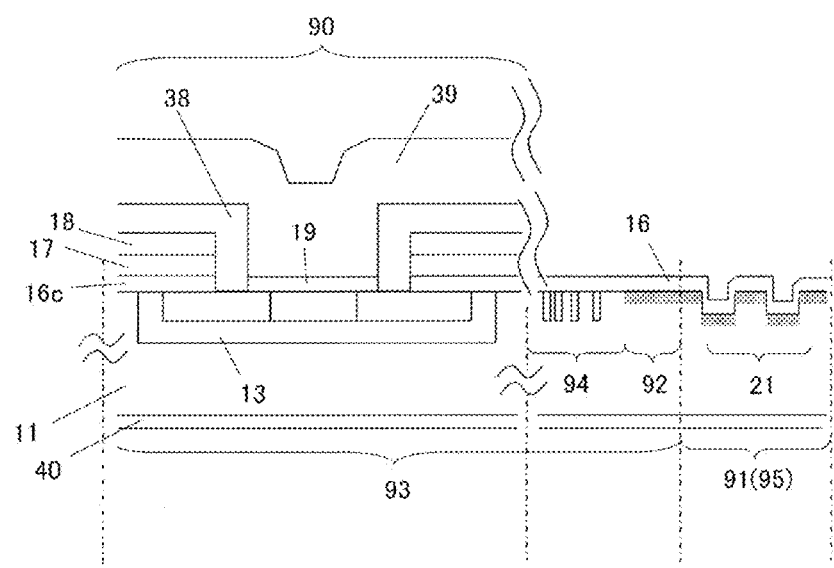
FIG. 5E is a diagram schematically illustrating the exemplary process of manufacturing the MOSFET to which the present exemplary embodiment is applied.

As illustrated in FIG. 5E, a MOSFET including a plurality of unit cells 90 is produced in element region 93. Alignment pattern 21 is used as necessary for mask positioning in production of the MOSFET. The coordinates of alignment pattern 21 can be accurately estimated as described above when epitaxial layer 16 is formed on alignment pattern 21.

Epitaxial layer 16 is etched to obtain channel layer 16c. In this etching process, alignment pattern 21 is used to form an etching mask. Subsequently, gate insulating film 17 is formed by thermally oxidizing channel layer 16c or accumulating an insulating film on epitaxial layer 16.

Gate electrode 18 is formed on gate insulating film 17 by patterning a conductive film made of polysilicon or metallic material. Thereafter, interlayer insulating film 38 is formed to cover gate electrode 18, and provided with an opening through patterning. Alignment pattern 21 is used to perform mask positioning in the step of patterning the conductive film to form gate electrode 18 or the step of patterning interlayer insulating film 38.

Subsequently, source electrode 19 electrically connected with p contact region 15 and source region 14 is formed in the opening of interlayer insulating film 38. Source electrode 19 can be formed through conductive film patterning or a salicide process. After source electrode 19 is formed, upper part wiring electrode 39 electrically connected with source electrode 19 is provided. Drain electrode 40 is formed on the back surface of bulk substrate 11. In this manner, the MOSFET manufacturing is completed.

Alignment pattern 21 in which ion-injected layer 25 is formed according to the present exemplary embodiment can be used to accurately perform mask positioning after epitaxial layer 16 is formed, thereby achieving manufacturing of a high-quality MOSFET.

Scribe region 95 including alignment region 91 is finally removed by cutting. However, part of alignment pattern 21 in which ion-injected layer 25 is formed can remain outside of element region 93. This indicates application of the present exemplary embodiment to the MOSFET.

In the following, the accuracy of mask positioning is compared between when no ion-injected layer 25 is formed in alignment pattern 21 and when ion-injected layer 25 is formed in alignment pattern 21.

FIG. 6A is a diagram illustrating an exemplary difference amount of superposition in off direction 22 when gate electrode 18 is superposed on bulk substrate 11 by using alignment pattern 21 in which no ion-injected layer 25 is formed. The standard deviation a of the difference amount with 35 samples is 0.21 μm. The difference amount of superposition is large when alignment pattern 21 in which no ion-injected layer 25 is formed is used. In this case, too, however, the difference amount of superposition is small in a direction orthogonal to off direction 22.

FIG. 6B is a diagram illustrating an exemplary difference amount of superposition in off direction 22 when gate electrode 18 is superposed on bulk substrate 11 by using alignment pattern 21 in which ion-injected layer 25 is formed. The standard deviation a of the difference amount with 35 samples is 0.02 μm. Thus, the superposition is significantly highly accurate and reliable when alignment pattern 21 in which ion-injected layer 25 is formed is used.

A semiconductor device and a method of manufacturing the same according to an exemplary embodiment of the present disclosure can be used for power devices and other applications.

What is claimed is:
1. A semiconductor device comprising:
a bulk substrate; and
an epitaxial layer formed on a surface of the bulk substrate, wherein:

a part of the surface of the bulk substrate is an alignment region including an alignment pattern defined by at least one recess or one protrusion, an ion-injected layer is formed in at least a part of the alignment region and contains at least one element of N and Al, the alignment region includes a plurality of protrusions and a plurality of recesses each defined by adjacent protrusions, and the ion-injected layer is formed on a top of each of the plurality of protrusions and a bottom of each of the plurality of recesses.

2. The semiconductor device according to claim 1, wherein, when viewed in a direction perpendicular to the surface of the bulk substrate, the epitaxial layer has a facet surface overlapping with a part of an edge of the at least one recess or one protrusion.

3. The semiconductor device according to claim 2, wherein:

the facet surface has a pair of sides each parallel to the part of the edge of the at least one recess or one protrusion, and when the bulk substrate is defined to be a lower part of the semiconductor device, and the epitaxial layer is defined to be an upper part of the semiconductor device, at least a part of the ion-injected layer is positioned directly below a side at an upper position among the pair of sides.

4. The semiconductor device according to claim 2, wherein:

the bulk substrate is an off substrate, the alignment pattern is defined by the at least one recess, and a part of the edge of the at least one recess extends in a direction orthogonal to an off direction of the off substrate, and is positioned at downstream side with respect to a center of the at least one recess in the off direction.

5. The semiconductor device according to claim 2, wherein:

the bulk substrate is an off substrate, the alignment pattern is defined by the at least one protrusion, and a part of the edge of the at least one protrusion extends in a direction orthogonal to an off direction of the off substrate, and is positioned at upstream side with respect to a center of the at least one protrusion in the off direction.

6. The semiconductor device according to claim 1, wherein the semiconductor device is a metal oxide semiconductor field effect transistor (MOSFET).

* * * * *